(12) United States Patent
Ikawa

(10) Patent No.: US 11,917,756 B2
(45) Date of Patent: Feb. 27, 2024

(54) PRINTED WIRING BOARD AND METHOD FOR MANUFACTURING PRINTED WIRING BOARD

(71) Applicant: IBIDEN CO., LTD., Gifu (JP)

(72) Inventor: Yuji Ikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 164 days.

(21) Appl. No.: 17/485,672

(22) Filed: Sep. 27, 2021

(65) Prior Publication Data

US 2022/0015231 A1 Jan. 13, 2022

Related U.S. Application Data

(62) Division of application No. 16/574,838, filed on Sep. 18, 2019, now abandoned.

(30) Foreign Application Priority Data

Sep. 27, 2018 (JP) .................................. 2018-181607

(51) Int. Cl.
| H05K 3/00 | (2006.01) |
| H05K 1/09 | (2006.01) |
| H05K 3/06 | (2006.01) |
| H05K 3/46 | (2006.01) |

(52) U.S. Cl.
CPC ............. *H05K 1/09* (2013.01); *H05K 3/0041* (2013.01); *H05K 3/062* (2013.01); *H05K 3/4632* (2013.01); *H05K 3/0079* (2013.01)

(58) Field of Classification Search
CPC ...... H05K 1/09; H05K 3/0041; H05K 3/4632; H01L 2224/73204
See application file for complete search history.

(56) References Cited

U.S. PATENT DOCUMENTS

| 7,999,368 | B2 | 8/2011 | Yim et al. |
| 8,143,110 | B2 | 3/2012 | Karpur et al. |
| 8,336,201 | B2 | 12/2012 | Choi et al. |
| 8,759,971 | B2 | 6/2014 | Hosokawa et al. |
| 10,438,863 | B1* | 10/2019 | Boja ........................ H01L 21/52 |
| 2006/0199920 | A1 | 9/2006 | Okada et al. |
| 2010/0139962 | A1* | 6/2010 | Kaneko ............. H01L 23/49816 |
| | | | 427/97.3 |
| 2010/0252304 | A1 | 10/2010 | Muramatsu et al. |
| 2011/0059304 | A1 | 3/2011 | Ushiyama |

(Continued)

*Primary Examiner* — Binh X Tran
(74) *Attorney, Agent, or Firm* — Oblon, McClelland, Maier & Neustadt, L.L.P.

(57) ABSTRACT

A method for manufacturing a printed wiring board includes forming metal posts on a conductor circuit formed on a resin insulating layer, forming the outermost resin layer on the resin insulating layer such that the metal posts is embedded in the outermost resin layer, forming a mask at a dam formation site for a dam structure of the outermost resin layer to surround at least part of a pad group including the metal posts on the outermost resin layer, and reducing a thickness of the outermost resin layer exposed from the mask such that end portions of the metal posts are exposed from the outermost resin layer, that the metal posts form the pad group, and that the outermost resin layer has the dam structure forming part of the outermost resin layer and formed to surround at least part of the pad group including the metal posts.

20 Claims, 4 Drawing Sheets

(56) References Cited

U.S. PATENT DOCUMENTS

| | | | |
|---|---|---|---|
| 2012/0000067 A1* | 1/2012 | Choi | H05K 3/3485 |
| | | | 29/846 |
| 2013/0069680 A1* | 3/2013 | Duckworth | H05K 3/4046 |
| | | | 324/754.03 |
| 2014/0185254 A1 | 7/2014 | Mok et al. | |
| 2014/0293547 A1* | 10/2014 | Kung | H05K 1/112 |
| | | | 361/728 |
| 2015/0061127 A1 | 3/2015 | Chen et al. | |
| 2015/0191588 A1 | 7/2015 | Choi et al. | |
| 2016/0316558 A1* | 10/2016 | Sakai | H01L 23/12 |
| 2019/0013255 A1* | 1/2019 | Costa | H01L 21/31133 |

\* cited by examiner

PRINTED WIRING BOARD AND METHOD FOR MANUFACTURING PRINTED WIRING BOARD

CROSS-REFERENCE TO RELATED APPLICATIONS

The present application is a divisional of U.S. patent application Ser. No. 16/574,838, filed Sep. 18, 2019, which is based upon and claims the benefit of priority to Japanese Patent Application No. 2018-181607, filed Sep. 27, 2018. The entire contents of these applications are incorporated herein by reference.

BACKGROUND OF THE INVENTION

Field of the Invention

The present invention relates to a printed wiring board in which an underfill material is filled after an IC is mounted, and relates to a method for manufacturing the printed wiring board.

Description of Background Art

U.S. Pat. No. 7,999,368 describes that a dam for stopping outflow of an underfill material is formed using an inkjet. The entire contents of this publication are incorporated herein by reference.

SUMMARY OF THE INVENTION

According to one aspect of the present invention, a printed wiring board includes a resin insulating layer, a conductor circuit formed on the resin insulating layer, an outermost resin layer formed on the resin insulating layer such that the outermost resin layer covers the conductor circuit, and multiple metal posts formed on the conductor circuit such that the metal posts have end portions exposed from the outermost resin layer and that the metal posts form a pad group. The outermost resin layer has a dam structure forming part of the outermost resin layer such that the dam structure is formed to surround at least part of the pad group including the metal posts.

According to another aspect of the present invention, a method for manufacturing a printed wiring board includes forming multiple metal posts on a conductor circuit formed on a resin insulating layer, forming an outermost resin layer on the resin insulating layer such that the metal posts is embedded in the outermost resin layer, forming a mask at a dam formation site for a dam structure of the outermost resin layer to surround at least part of a pad group including the metal posts on the outermost resin layer, and reducing a thickness of the outermost resin layer exposed from the mask such that end portions of the metal posts are exposed from the outermost resin layer, that the metal posts form the pad group, and that the outermost resin layer has the dam structure forming part of the outermost resin layer and formed to surround at least part of the pad group including the metal posts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
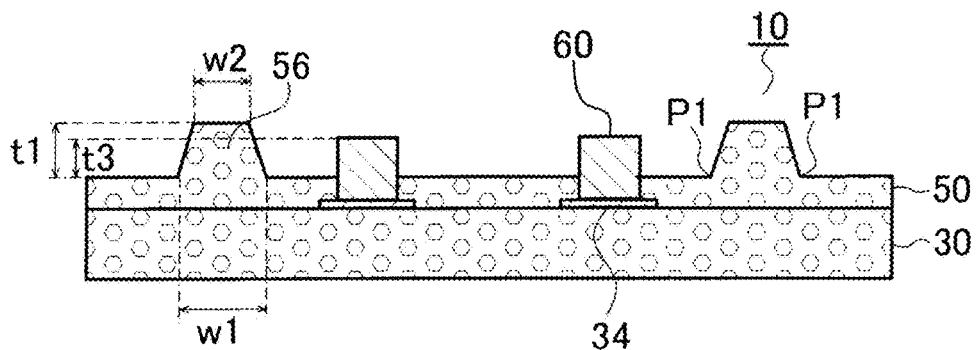
FIG. 1A is a cross-sectional view of a printed wiring board according to a first embodiment of the present invention.

Embodiments will now be described with reference to the accompanying drawings, wherein like reference numerals designate corresponding or identical elements throughout the various drawings.

First Embodiment

FIG. 1A is a cross-sectional view illustrating a structure of a printed wiring board according to a first embodiment of the present invention.

The printed wiring board 10 includes a resin insulating layer 30, a conductor circuit 34 formed on the resin insulating layer 30, metal posts 60 formed on the conductor circuit 34, and an outermost resin layer 50 formed on the resin insulating layer 30 and the conductor circuit 34. The resin insulating layer 30 and the outermost resin layer 50 are each formed of a resin material that does not contain a core material. For example, an ABF (Ajinomoto Build-up Film: manufactured by Ajinomoto Fine Techno Co., Ltd.) can be used. The resin insulating layer 30 and the outermost resin layer 50 are each formed of a resin that does not contain inorganic fibers but contains ultra-small inorganic filler particles. Specifically, the resin insulating layer 30 and the outermost resin layer 50 each include an epoxy-base resin, a polymer-based resin, and a curing agent. Of each of the metal posts 60, a lower portion is embedded in the outermost resin layer 50 and a front end protrudes from the outermost resin layer 50. A protruding amount (t3) of each of the metal posts 60 from the outermost resin layer 50 is 1-10 μm. The printed wiring board of the first embodiment has the metal posts 60 of which the front ends protrude from the outermost resin layer 50, and thus, can be connected to fine-pitch IC pads. Here, when the protruding amount of each of the metal posts 60 is less than 1 μm, the printed wiring board cannot be connected to fine-pitch IC pads. On the other hand, when the protruding amount exceeds 10 μm, reliability of the connection to the IC pads decreases.

Figure 4A:
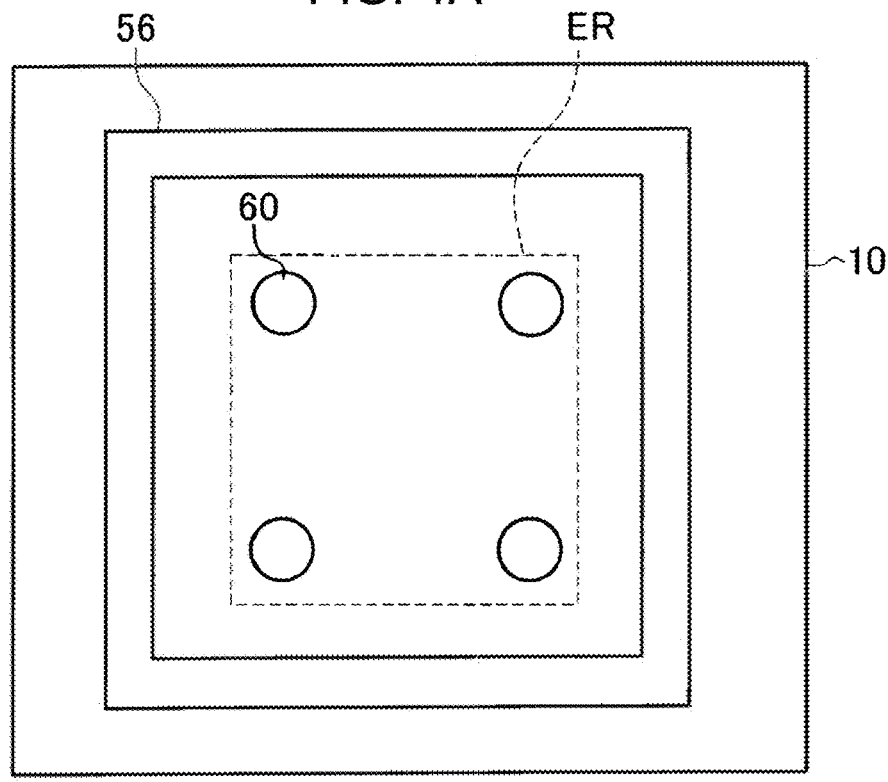
FIG. 4A is a plan view of the printed wiring board according to the first embodiment of the present invention.

FIG. 4A is a plan view of the printed wiring board of the first embodiment.

A pad group (ER) for mounting an IC is formed by multiple metal posts 60. A dam 56 for stopping outflow of an underfill material is formed surrounding the pad group (ER). In the printed wiring board of the first embodiment, the dam 56 is formed so as to completely surround the pad group (ER).

As illustrated in FIG. 1A, the dam 56 is formed as a part of the outermost resin layer 50. The dam 56 is formed to have a trapezoidal cross-sectional shape. Of the trapezoidal shape of the dam 56, a width (W2) of an upper base is 30-230 μm, a width (W1) of a lower base is 50-250 μm, and a height (t1) is 10-30 μm. Since the dam has a trapezoidal cross-sectional shape, as compared to a case where a dam is vertical (has a rectangular cross-sectional shape), a stress is less likely to concentrate at an interface (P1) between a bottom edge of the dam and the outermost resin layer 50, and a crack due to thermal contraction is less likely to occur. When the width (W1) of the lower base of the trapezoid of the dam 56 is less than 50 μm, rigidity of the dam is low and it is difficult to maintain reliability. On the other hand, when the width (W1) of the lower base of the trapezoid exceeds 250 μm, densification of the printed wiring board is hindered. When the height (t1) of the dam 56 is less than 10 μm, it is difficult to stop outflow of the underfill material. When the height (t1) of the dam 56 exceeds 30 μm, interference with an IC may occur, making it difficult to mount the IC.

In the printed wiring board 10 of the first embodiment, the dam 56 surrounding the pad group (ER) for mounting is provided. Therefore, outflow of the underfill material can be prevented and a connection failure of the pads for mounting can be suppressed. The dam 56 is formed as a part of the outermost resin layer 50, and thus, a connecting part does not exist between the dam 56 and the outermost resin layer 50. Therefore, the dam 56 is unlikely to peel off from the outermost resin layer 50, and thus, is strong and highly reliable. Further, the number of manufacturing processes can be reduced. Since the resin insulating layer 30 and the outermost resin layer 50 having the dam 56 are formed of the same resin, manufacturing cost can be reduced.

Figure 4B:
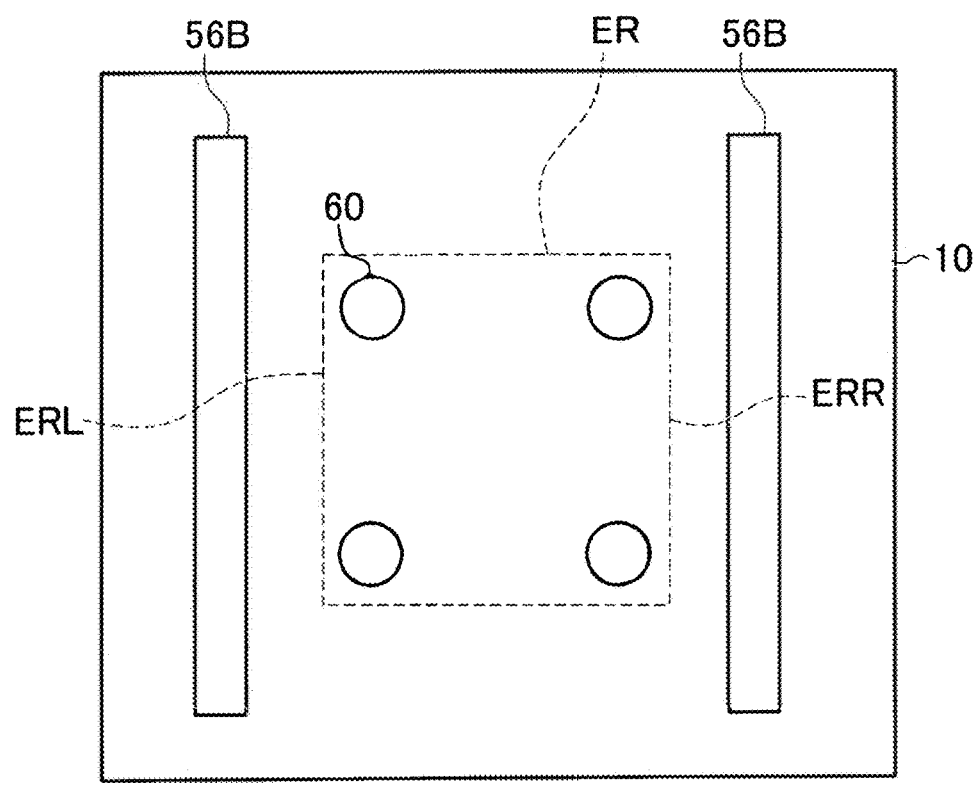
FIG. 4B is a cross-sectional view of a printed wiring board of a first modified embodiment of the first embodiment.

FIG. 4B is a plan view of a printed wiring board of a first modified embodiment of the first embodiment.

In the printed wiring board of the first modified embodiment of the first embodiment, a pair of dams (56B) are formed so as to sandwich part of the pad group (ER) (a right side (ERR) and a left side (ERL)).

Manufacturing Method of First Embodiment

FIGS. 2A-2C and 3A-3C illustrate a method for manufacturing the printed wiring board of the first embodiment.

Figure 2A:
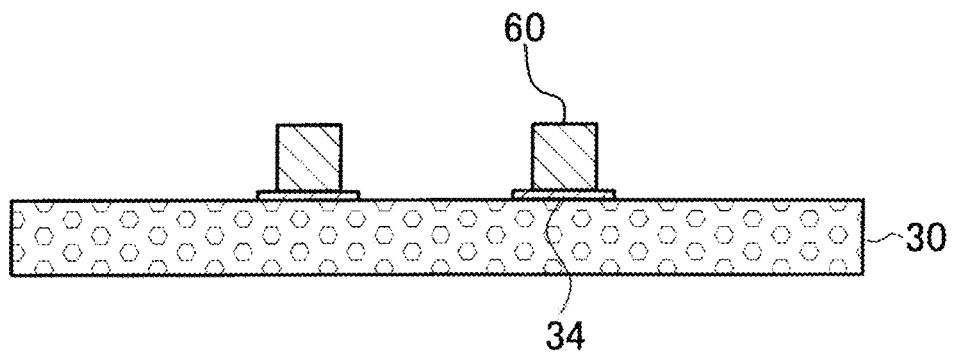
FIGS. 2A-2C are manufacturing process diagrams of the printed wiring board of the first embodiment.
Figure 2B:
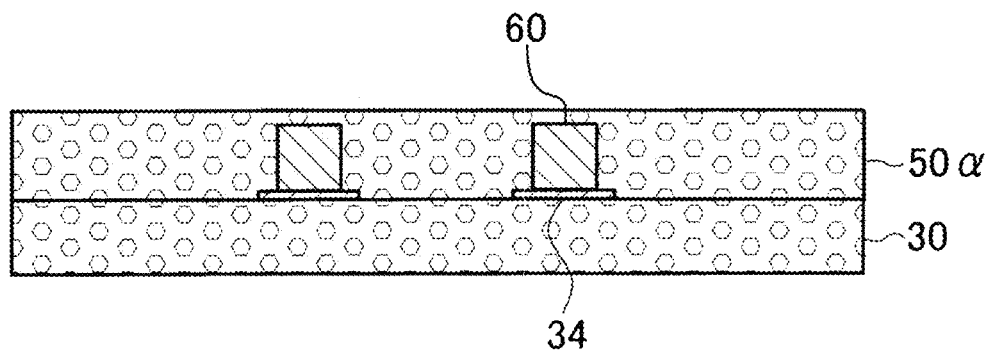
Figure 2C:
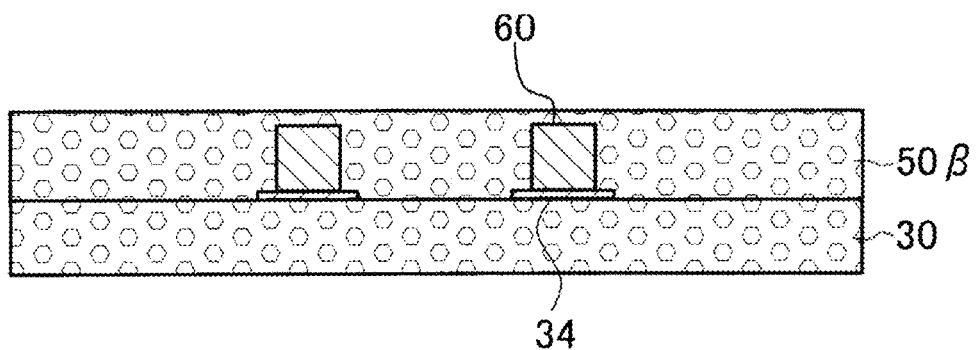

The conductor circuit 34 is formed on the resin insulating layer 30, and the metal posts 60 are formed on the conductor circuit 34 (FIG. 2A). A composition (50a) of the outermost resin layer is formed on the resin insulating layer 30, the conductor circuit 34, and the metal posts 60 (FIG. 2B). The composition of the outermost resin layer is semi-cured, and a semi-cured product (50β) of the outermost resin layer is formed (FIG. 2C).

Figure 3A:
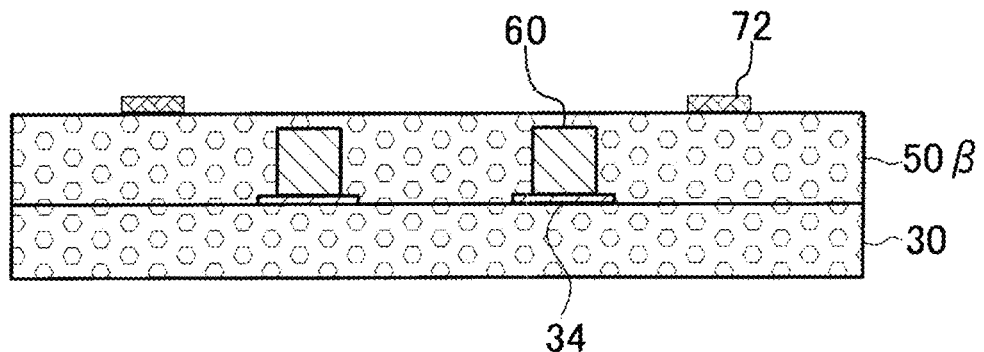
FIGS. 3A-3C are manufacturing process diagrams of the printed wiring board of the first embodiment.
Figure 3B:
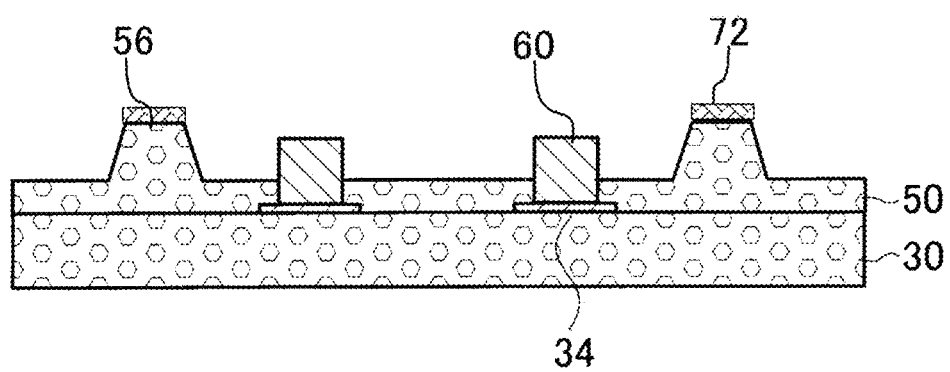
Figure 3C:
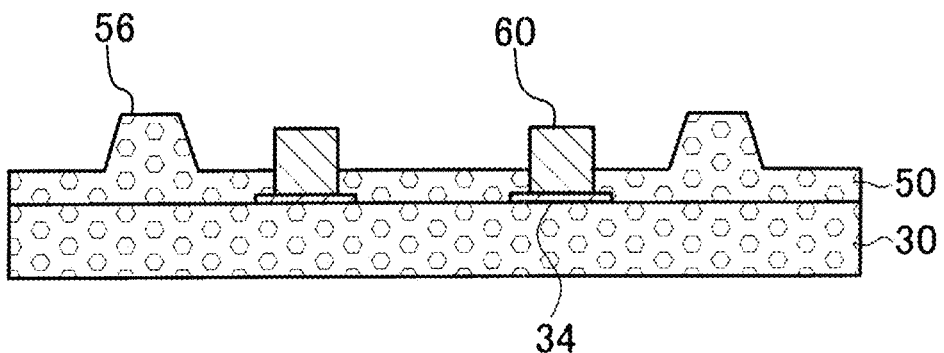

A mask 72 is formed at a dam formation position on the semi-cured product (50β) of the outermost resin layer (FIG. 3A). The mask 72 is formed by subjecting a dry film to exposure and development or by patterning a metal foil. A Plasma treatment using a mixed gas of O2 and CF4 is performed, a thickness of the semi-cured product (50β) of the outermost resin layer exposed from the mask 72 is reduced, the front ends of the metal posts 60 are exposed, and the dam 56 is formed (FIG. 3B). Here, the plasma treatment is used. However, the thickness of the outermost resin layer can also be reduced by a blast treatment. The mask 72 is removed, the semi-cured product (50β) is completely cured, and the outermost resin layer 50 having the dam 56 is formed (FIG. 3C).

In the method for manufacturing the printed wiring board of the first embodiment, since the dam 56 is provided, outflow of the underfill material can be prevented, and a connection failure of the metal posts 60 can be suppressed. The dam 56 is formed by not reducing the thickness of the outermost resin layer 50 under the mask 72, and a connecting part does not exist between the dam 56 and the outermost resin layer 50. Therefore, the dam 56 is unlikely to peel off from the outermost resin layer 50, and thus, is strong and highly reliable. Further, as compared to a case where the dam 56 is separately formed, the number of manufacturing processes can be reduced.

Second Modified Embodiment of First Embodiment

Figure 1B:
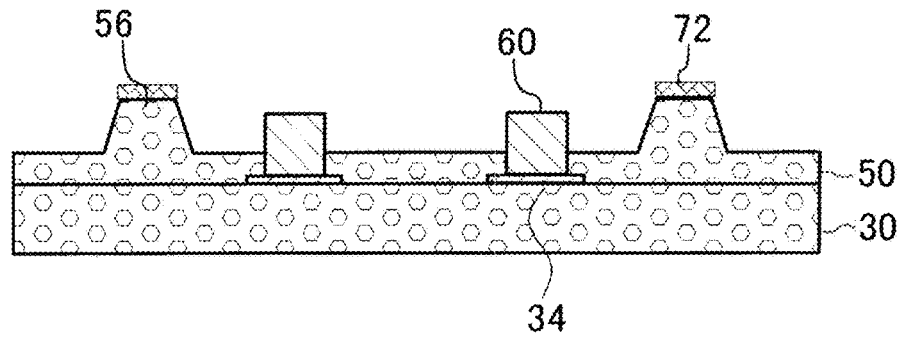
FIG. 1B is a cross-sectional view of a printed wiring board of a second modified embodiment of the first embodiment.

FIG. 1B illustrates a cross section of a printed wiring board according to a second modified embodiment of the first embodiment. In the printed wiring board according to the second modified embodiment of the first embodiment, the metal foil (metal pattern) 72 used as the mask in the manufacturing process of the first embodiment illustrated in FIG. 3B is not removed and remains as a part of the dam 56.

Third Modified Embodiment of First Embodiment

Figure 1C:
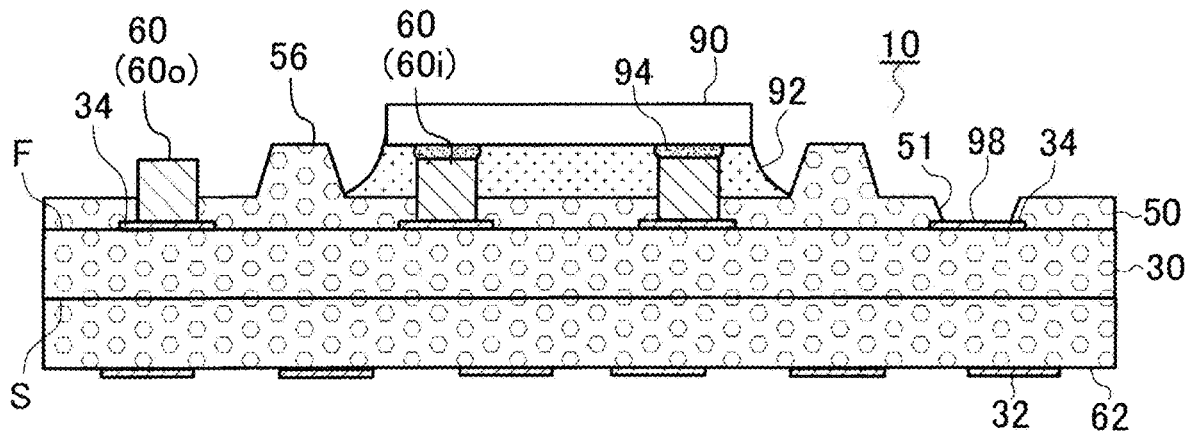
FIG. 1C is a cross-sectional view of a printed wiring board of a third modified embodiment of the first embodiment.

FIG. 1C illustrates a cross section of a printed wiring board according to a third modified embodiment of the first embodiment. In the printed wiring board according to the third modified embodiment of the first embodiment, the resin insulating layer 30 has a first surface (F) and a second surface (S) on an opposite side with respect to the first surface. The conductor circuit 34 and the metal posts 60 are formed on the first surface (F) side of the resin insulating layer 30, and the outermost resin layer 50 is formed on the resin insulating layer 30 and the conductor circuit 34. Further, openings 51 exposing the conductor circuit 34 are formed in the outermost resin layer 50. The conductor circuit 34 exposed from the openings 51 forms pads 98. The outermost resin layer 50 has the dam 56. A lowermost resin layer 62 is formed on the second surface (S) of the resin insulating layer 30. Pads 32 for mounting an external substrate are formed on an exposed surface of the lowermost resin layer 62. A conductor circuit (not illustrated in the drawings) is formed on the second surface (S) of the resin insulating layer, and via conductors (not illustrated in the drawings) are formed in the resin insulating layer 30 and the lowermost resin layer 62.

Center-side metal posts (60i) surrounded by the dam 56 are provided on a center side of the printed wiring board, and outer-side metal posts (60o) are provided on an outer side of the dam 56. An IC chip 90 is connected to the center-side metal posts (60i) via solders 94. An underfill material 92 is filled between the printed wiring board 10 and the IC chip 90. A printed wiring board (not illustrated in the drawings) is mounted on the outer-side metal posts (60o) on the outer side of the dam 56.

Since the printed wiring board of the first embodiment has the dam 56, outflow of the underfill material 92 can be prevented and a connection failure at the outer-side metal posts (60o) can be suppressed. Further, when the underfill material flows into the openings 51, it may cause a connection failure of the pads 98. However, this connection failure can be suppressed.

Second Embodiment

Figure 1D:
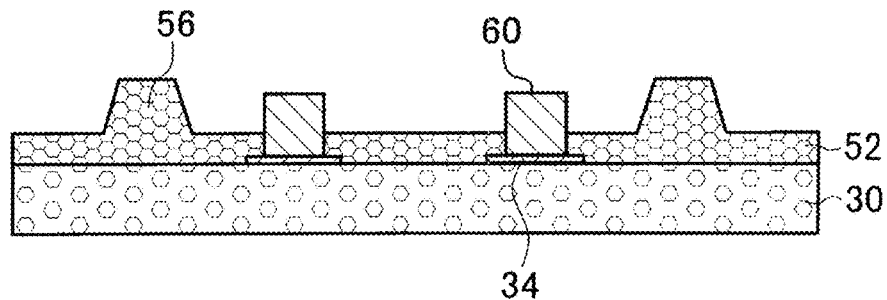
FIG. 1D is a cross-sectional view of a printed wiring board of a second embodiment.

FIG. 1D is a cross-sectional view illustrating a structure of a printed wiring board according to a second embodiment of the present invention.

The printed wiring board 10 of the second embodiment includes a resin insulating layer 30, a conductor circuit 34 formed on the resin insulating layer 30, metal posts 60 formed on the conductor circuit 34, and a solder resist layer 52 formed on the resin insulating layer 30 and the conductor circuit 34. The solder resist layer 52 has a dam 56.

The solder resist layer 52 and the dam 56 are integrally formed. In the second embodiment, similarly to the first embodiment, a mask can be provided at the dam formation site, and a thickness of the solder resist layer 52 of a dam-exposed portion can be reduced by a plasma treatment or a blast treatment. Further, by exposure and development, the solder resist layer 52 that includes the dam 56 and exposes the front ends of the metal posts 60 can be formed.

After the IC is mounted, the IC is fixed by filling the underfill material between the IC and the printed wiring board. However, the underfill material may flow and cover pads on the same surface such as pads for memory IC wire bonding connection, which may reduce connection reliability.

In U.S. Pat. No. 7,999,368, the dam and an insulating layer on which the dam is provided are formed of different materials. Therefore, it is thought that a problem in adhesion may occur. Further, it is thought that the number of processes is increased and cost is increased.

A printed wiring board according to an embodiment of the present invention includes: a resin insulating layer; a conductor circuit formed on the resin insulating layer; an outermost resin layer provided on the resin insulating layer and the conductor circuit; metal posts that are formed on conductor circuit and of which front ends are exposed from the outermost resin layer; and a dam that is formed as a part of the outermost resin layer and surrounds a part of or an entire pad group for mounting formed by the metal posts.

A method for manufacturing a printed wiring board according to another embodiment of the present invention includes: forming metal posts on a resin insulating layer; forming an outermost resin layer on the resin insulating layer and the metal posts so as to embed the metal posts; forming a mask at a dam formation site on the outermost resin layer; and reducing a thickness of the outermost resin layer exposed from the mask by a plasma treatment or a blast treatment so as to expose front ends of the metal posts.

According to a printed wiring board of an embodiment of the present invention, the dam surrounding the pad group for mounting is provided. Therefore, outflow of an underfill material can be prevented and a connection failure of the pads for mounting can be suppressed. The dam is formed as a part of the outermost resin layer, and thus, a connecting part does not exist between the dam and the outermost resin layer. Therefore, the dam is unlikely to peel off from the outermost resin layer, and thus, is strong and highly reliable. Further, the number of manufacturing processes can be reduced.

According to a method for manufacturing a printed wiring board of an embodiment of the present invention, the dam is provided. Therefore, outflow of an underfill material can be prevented and a connection failure of the pads can be suppressed. The dam is formed by not reducing the thickness of the outermost resin layer under the mask, and a connecting part does not exist between the dam and the outermost resin layer. Therefore, the dam is unlikely to peel off from the outermost resin layer, and thus, is strong and highly reliable. Further, the number of manufacturing processes can be reduced.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a printed wiring board, comprising:
    forming a plurality of metal posts on a conductor circuit formed on a resin insulating layer;
    forming an outermost resin layer on the resin insulating layer such that the metal posts is embedded in the outermost resin layer;
    forming a mask at a dam formation site for a dam structure of the outermost resin layer to surround at least part of a pad group comprising the plurality of metal posts on the outermost resin layer; and
    reducing a thickness of the outermost resin layer exposed from the mask such that end portions of the metal posts are exposed from the outermost resin layer, that the plurality of metal posts forms the pad group, and that the outermost resin layer has the dam structure forming part of the outermost resin layer and formed to surround at least part of the pad group comprising the plurality of metal posts.

2. The method for manufacturing a printed wiring board according to claim 1, wherein the forming of the mask comprises subjecting a dry film to exposure and development.

3. The method for manufacturing a printed wiring board according to claim 1, wherein the forming of the mask comprises patterning a metal foil formed on the outermost resin layer.

4. The method for manufacturing a printed wiring board according to claim 1, wherein the reducing of the thickness of the outermost resin layer comprises applying one of a plasma treatment and a blast treatment to the outermost resin layer such that the end portions of the metal posts are exposed from the outermost resin layer.

5. The method for manufacturing a printed wiring board according to claim 1, wherein the resin insulating layer and the outermost resin layer are formed of same resin material.

6. The method for manufacturing a printed wiring board according to claim 1, wherein the plurality of metal posts is formed such that each of the metal posts has a protruding amount in a range of 1 to 10 μm.

7. The method for manufacturing a printed wiring board according to claim 1, wherein the dam structure is a dam formed to surround the pad group entirely.

8. The method for manufacturing a printed wiring board according to claim 1, wherein the dam structure is a plurality of dams formed to surround part of the pad group.

9. The method for manufacturing a printed wiring board according to claim 1, further comprising:
    forming an opening in the outermost resin layer outside a perimeter of the dam structure such that the opening exposes a portion of the conductor circuit and forms a pad positioned outside the perimeter of the dam structure.

10. The method for manufacturing a printed wiring board according to claim 9, further comprising:
   forming an outer-side metal post on the pad positioned outside the perimeter of the dam structure.

11. The method for manufacturing a printed wiring board according to claim 1, wherein the dam structure has a trapezoidal cross-sectional shape.

12. The method for manufacturing a printed wiring board according to claim 11, wherein the dam structure is formed such that a lower base of the trapezoidal cross-sectional shape has a length in a range of 50 to 250 µm, and a height in a range of 10 to 30 µm.

13. The method for manufacturing a printed wiring board according to claim 1, further comprising:
   removing the mask from the outermost resin layer after the reducing of the thickness of the outermost resin layer.

14. The method for manufacturing a printed wiring board according to claim 13, wherein the forming of the mask comprises subjecting a dry film to exposure and development.

15. The method for manufacturing a printed wiring board according to claim 13, wherein the forming of the mask comprises patterning a metal foil formed on the outermost resin layer.

16. The method for manufacturing a printed wiring board according to claim 13, wherein the reducing of the thickness of the outermost resin layer comprises applying one of a plasma treatment and a blast treatment to the outermost resin layer such that the end portions of the metal posts are exposed from the outermost resin layer.

17. The method for manufacturing a printed wiring board according to claim 13, further comprising:
   forming an opening in the outermost resin layer outside a perimeter of the dam structure such that the opening exposes a portion of the conductor circuit and forms a pad positioned outside the perimeter of the dam structure.

18. The method for manufacturing a printed wiring board according to claim 17, further comprising:
   forming an outer-side metal post on the pad positioned outside the perimeter of the dam structure.

19. The method for manufacturing a printed wiring board according to claim 13, wherein the resin insulating layer and the outermost resin layer are formed of same resin material.

20. The method for manufacturing a printed wiring board according to claim 13, wherein the dam structure has a trapezoidal cross-sectional shape.

* * * * *